United States Patent [19]

Lau et al.

[11] Patent Number: 5,032,568

[45] Date of Patent: Jul. 16, 1991

[54] DEPOSITION OF SUPERCONDUCTING THICK FILMS BY SPRAY INDUCTIVELY COUPLED PLASMA METHOD

[75] Inventors: Yuk-Chiu Lau, New Brighton; Emil Pfender, West St. Paul, both of Minn.

[73] Assignee: Regents of the University of Minnesota, Minneapolis, Minn.

[21] Appl. No.: 402,066

[22] Filed: Sep. 1, 1989

[51] Int. Cl.$^5$ ............................ B05D 1/02; B05D 5/12
[52] U.S. Cl. ........................................ 505/1; 505/737; 505/730; 427/34; 427/62; 427/22b; 427/226; 427/314; 427/421
[58] Field of Search ...................... 427/62, 63, 34, 226, 427/314, 421; 505/1, 737, 725

[56] References Cited

U.S. PATENT DOCUMENTS 3,340,020  9/1967  Neumachwander et al. ......... 23/349
4,361,114  1/1982  Gurev ................................. 118/723

FOREIGN PATENT DOCUMENTS 57-73178  5/1982  Japan .
01-27132  1/1989  Japan .

OTHER PUBLICATIONS

Koukitu et al., "Preparation of Y—Ba—Cu—O Superconducting Thin Films by the Mist Microwave Plasma Decomposition Method", Jpn. J. Appl. Phys. vol. 28(7) L1212–1213, Jul. 1989.
Meng et al., "High Tc Superconducting Thin Films by Chemical Spray Deposition", Int. J. Mod. Phys. B vol. 1 (2) pp. 579–582 (1987).
Gurvitch et al., "Preparation and Substrate Reactions of Superconducting Y—Ba—Cu—O films", Appl. Phys. Lett. 51(13) Sep. 1987, pp. 1027–1029.
P. K. Bachman et al., MRS Bull., 13, 52 (1988).
J. G. Bendorz et al., Z. Phys. B, 64, 189 (1986).
B. A. Biegel et al., in High-$T_c$ Superconductivity: Thin Films and Devices, SPIE Pro. vol. 948; R. B. Van Dover et al., Eds, pp. 3–9.
I. F. M. Bosch et al., Silicates Industriels, 27, 587 (1962).
R. J. Cava et al., Nature, 332, 814 (1988).
C. W. Chu et al., Phys. Rev. Lett., 58, 405 (1987).
M. E. Chowher et al., J. Cryst. Growth, 46, 339 (1979).
J. J. Cuomo et al., Adv. Cer. Mat., 2, 422 (1987).
P. H. Dickinson et al., J. Appl. Phys., 66, 444 (1989).
P. K. Gallagher et al., MRS Bull., 22, 995 (1987).
P. M. Grant et al., Phys. Rev. Lett., 58, 2482 (1987).
C. R. Guarnieri et al., Appl. Phys. Lett., 53, 532 (1988).
P. Haldar et al., Science, 241, 1198 (1988).
R. M. Hazen et al., Phys. Rev. Lett., 60, 1657 (1988).
M. Hong et al., Appl. Phys. Lett., 51, 694 (1987).
Y. Ichikawa et al., J. Appl. Phys., 27, L381 (1988).
D. C. Johnston et al., Phys. Rev. B, 36, 4007 (1987).
M. Kagawa et al., J. Am. Ceram. Soc., 66, 751 (1983).
M. Kagawa et al., Science Reports of the Research Inst. of Tohoku Univ., 31, 216 (1983).
T. T. Kodas et al., Appl. Phys. Lett., 52, 1622 (1988).
T. T. Kodas et al., Appl. Phys. Lett., 54, 1923 (1989).
J. Kwo et al., Phys. Rev. B, 36, 4039 (1987).
O. K. Kwon et al., IEEE Electron Dev. Lett., 8, 582 (1987).
R. B. Laibowitz et al., Phys. Rev. B, 35, 8821 (1987).
R. B. Laibowitz, MRS Bull., 14, 58 (1989).
D. K. Lathrop et al., Appl. Phys. Lett., 51, 1554 (1987).
W. Y. Lee et al., Appl. Phys. Lett., 52, 2263 (1988).
H. C. Li et al., Appl. Phys. Lett., 52, 1098 (1988).
J. M. Longo et al., J. Solid State Chem., 6, 526 (1973).

(List continued on next page.)

Primary Examiner—Norman Morgenstern
Assistant Examiner—Roy V. King
Attorney, Agent, or Firm—Merchant, Gould, Smith, Edell, Welter & Schmidt

[57] ABSTRACT

A method is provided to apply a coating of a superconducting ceramic oxide to a substrate comprising introducing an atomized aqueous solution comprising at least three metal salts into inductively coupled plasma so as to deposit a superconductive ceramic oxide on the substrate, or alternatively, to deposit a mixed metal oxide on the substrate, which is converted into a superconductive ceramic oxide by post-annealing.

20 Claims, 3 Drawing Sheets

OTHER PUBLICATIONS

I. M. MacKinnon et al., *J. Electrochem. Soc.*, 122, 806 (1975).
H. Maeda et al., *Jpn. J. Appl. Phys.*, 27, L209 (1988).
P. M. Mankiewich et al., *Appl. Phys. Lett.*, 51, 1753 (1987).
P. M. Mankiewich et al., *Mat Res. Soc. Symp. Proc.*, 99, 119 (1988).
A. F. Marshall et al., *Appl. Phys. Lett.*, 53, 426 (1988).
D. W. Murphy et al., *Science*, 241, 922 (1988).
Y. Nakayama et al., *J. Appl. Phys.*, 28, L1217 (1989).
B. Oh et al., *Appl. Phys. Lett.*, 51, 852 (1987).
T. Ono et al., *Plasma Chemistry and Plasma Processing*, 7, 201 (1987).
S. R. Ovshinsky et al., *Phys. Rev. Lett.*, 58, 2579 (1987).
A. J. Panson et al., *Appl. Phys. Lett.*, 53, 1756 (1988).
D. A. Robinson et al., *Mat. Res. Soc. Symp. Proc.*, 99, 587 (1988).
Z. Z. Sheng et al., *Nature* 332, 55 (1988).
Z. Z. Sheng et al., *Phys. Rev. Lett.*, 60, 937 (1988).
R. M. Silver et al., *Appl. Phys. Lett.*, 52, 2174 (1988).
M. A. Subramanian et al., *Science*, 239, 1015 (1988).
H. Tamura et al., *Appl. Phys. Lett.*, 52, 2183 (1988).
K. Terashima et al., *Appl. Phys. Lett.*, 52, 1274 (1988).
T. Terashima et al., *Jpn. J. Appl. Phys.*, 27, L91 (1988).
D. F. Vaslow et al., *Appl. Phys. Lett.*, 53, 324 (1988).
R. J. Webb et al., *IEEE Trans. Magn.*, MAG-21, 835 (1985).
R. J. Webb et al., *J. Vac. Sci. Technol. A*, 3, 1907 (1985).
A. J. Wickens, *Chemistry and Industry*, No. 7, 316 (1976).
S. Witanachchi et al., *Appl. Phys. Lett.*, 53, 234 (1988).
M. K. Wu et al., *Phys. Rev. Lett.*, 58, 908 (1987).
X. D. Wu et al., *Appl. Phys. Lett.*, 52, 754 (1988).
O. Kohno et al., *Jpn. J. Appl. Phys.*, 26, 1653 (1987).
S. Jin et al., *Appl. Phys. Lett.*, 51, 203 (1987).
J. B. Parise and A. W. Sleight et al., *J. Solid State Chem.*, 76, 432 (1988).
M. A. Subramanian and A. W. Sleight et al., *Nature*, 332, 420 (1988).

DEPOSITION OF SUPERCONDUCTING THICK FILMS BY SPRAY INDUCTIVELY COUPLED PLASMA METHOD

The present invention was made with the assistance of the National Science Foundation under grants NSF/MSM-8815734 and CDR-8721545. The Government has certain rights in the invention.

BACKGROUND OF THE INVENTION

Superconductors are materials which can conduct electricity with virtually no resistance when they are cooled below a certain temperature, referred to as the superconductive transition temperature ($T_c$) For example, pure metals or alloys such as niobium-germanium ($Nb_3Ge$) reach the superconductive state when they are cooled below 23K. That degree of cooling requires the use of liquid helium, which condenses at 4K. Liquid helium is expensive and is difficult to manipulate.

A major breakthrough in the commercial development of this technology came in January of 1987, when a yttriumbarium copper oxide ceramic ($Y_{1.2}Ba_{0.8}CuO_4$) was prepared which achieved superconductivity at a T of about 90K. See C. W. Chu et al., *Phys. Rev. Lett.*, 58, 405 (1987). This degree of cooling can be readily accomplished with liquid nitrogen (bp 77K or $-196°$ C.), which is much less expensive and easier to handle than is liquid helium.

Since the discovery of high temperature superconductivity in the 2-1-1 oxides (of the form $La_{2-x}Sr_x$-$CuO_4$), the 1-2-3 oxides (of the form $YBa_2Cu_3O_{7-x}$), and the 2-1-2-2 oxides of Bi and Tl (of the form $Bi_2$-$Ca_{1+x}Sr_{2-x}Cu_2O_{8+y}$ or $Tl_2Ca_{1+x}Sr_{2-x}Cu_2O_{8+y}$), it has been apparent that the incorporation of these and related materials into existing and new technologies will require the solution of a large number of materials-related problems.

For example, a variety of electronic applications have been proposed for the new superconductors, including high-speed chip interconnections or active devices. See O. K. Kwon et al., *IEEE Electron Dev. Lett.*, 8, 582 (1987); R. Singh et al., in *High-T. Superconductivity: Thin Films and Devices*, SPIE Pro. Vol. 948; R. B. Van Dover et al., eds. (SPIE-Int'l Soc. for Optical Engineering, Bellingham, Wash., 1988), pp. 3-9; R. B. Laibowitz, *MRS Bull.*, 14, 58 (1989). These applications require high quality thin- and/or thickfilm structures.

There are three requirements to form these high quality superconducting films: stoichiometry, crystallinity, and substrate interaction. The first requirement is to provide the relevant atoms in a precise stoichiometric ratio. Secondly, the correct phase must be formed by proper heat treatment and orientation with the substrate, preferably with the c-axis normal to the substrate surface. Thirdly, chemical reaction between the superconductor and the substrate during annealing must be limited to prevent contamination of the film or changes in stoichiometry by interdiffusion. The most commonly used substrate materials are single crystals of strontium titanate, magnesium oxide and yttria-stabilized zirconia with cubic structures. Films have also been made on other materials such as sapphire, alumina, and silicon.

Of the various film-forming techniques, physical vapor deposition processes such as sputtering [M. Hong et al., *Appl. Phys. Lett.*, 51, 694 (1987)], electron beam evaporation or coevaporation [A. F. Marshall et al., *Appl. Phys. Lett.*, 53 426 (1988)], laser ablation [C. R. Guarnieri et al., *Appl. Phys. Lett.*, 53. 532 (1988)], and spray pyrolysis [D. F. Vaslow et al., Appl. Phys. Lett., 53, 324 (1988); T. F. Kodas et al., *Appl. Phys. Lett.*. 54, 1923 (1989)] have been extensively investigated. Most of these processes require high vacuum systems and provide very low deposition rates (no more than several hundreds A/min). Another method such as plasma spraying which does not involve vapor deposition but rather melting of particles has also been investigated [J. J. Cuomo et al., *Adv. Cer Mat.*, 2, 422 (1987)], and, recently, chemical vapor deposition (CVD) of superconducting films has been reported by several research groups. See, e.g., A. J. Panson et al., *Appl. Phys. Lett.*, 53, 1756 (1988); P. H. Dickinson et al., *J. Appl. Phys.*, 66, 444 (1989}. In contrast to physical vapor deposition, CVD does not require high vacuum systems and permits a wide variety of processing environments, including low pressure through atmospheric pressure, and is a proven method for depositing compositionally homogeneous films over large areas [M. E. Cowher et al., *J. Cryst Growth.*, 46, 399 (1979)] and even on nonplanar objects. Using CVD, dense, well-crystallized and textured films can usually be obtained by proper control of the deposition conditions. The CVD films can also be grown under an oxygen-rich environment yielding superconducting films without any post-annealing procedure. In a conventional CVD process, reactants are delivered by a cold gas, and chemical reactions take place in a boundary layer over a substrate which is usually heated to promote the deposition reaction and/or provide sufficient mobility of the adatoms to form the desired film structure.

One variant of CVD which is receiving increased interest is plasma-assisted CVD (PACVD) [P. K. Bachman et al., *MRS Bull.*, 13, 52 (1988)]. According to the state of the plasma used, PACVD can be classified into two categories low pressure (non-thermal) PACVD, and thermal PACVD. To date, several research groups have reported on utilizing thermal PACVD to deposit thick coatings of SiC, diamond and the Y-Ba-Cu-O superconductor. A high deposition rate of over 10 $\mu m/min$ has been demonstrated. In the case of superconducting Y-Ba-Cu-O films as reported by K. Terashima et al., *Appl. Phys. Lett.*, 52, 1274 (1988), a mixture of $BaCO_3$, $Y_2O_3$, and CuO powders (ca. 1 $\mu m$) was fed into a thermal rf $Ar+O_2$ plasma. The generated vapor mixtures were then deposited onto <100> MgO single-crystal substrates placed in the tail flame of the rf plasma. The substrate was heated by the plasma to about 650° C. The deposition rate was more than 10 $\mu m/min$. No annealing was performed after the deposition. The structure of the prepared films was identified as the orthorhombic superconducting phase and some of the as-produced films showed the preferred orientation of <001≦. The as-deposited film showed a superconducting transition temperature (50% drop of resistivity) of 94K.

However, a continuing need exists for methods to prepare superconducting films.

BRIEF DESCRIPTION OF THE INVENTION

The present invention provides a method to apply a film of a mixed metal oxide on the surface of a substrate by employing the techniques of inductively coupled plasma (ICP) deposition using a solution containing a plurality of metal ions as the reactant. The solution is atomized and introduced into the core of a thermal plasma, resulting in the downstream deposition of a film comprising a mixed oxide of the dissolved metal ions on the target surface.

If sufficient oxygen is present in the plasma, and/or is provided by the counterions of the dissolved metal salts, a superconducting ceramic oxide film may be deposited directly on the target surface. If less oxygen is present, a semiconducting mixed metal oxide film is formed, which then can be post-annealed in an oxygen atmosphere to yield a superconducting ceramic oxide film.

In one embodiment of the present method, superconducting thick films of $YBa_2Cu_3O_{7-x}$ have been prepared using mixed aqueous nitrate solutions as precursors. When pure argon plasmas are used, post-annealing is necessary to produce the superconducting phase of $YBa_2Cu_3O_{7-x}$. Under the same experimental conditions, films on $ZrO_2$ substrates reveal better transition properties than films on $Al_2O_3$ substrates. The transition temperature of the superconducting films on $ZrO_2$ substrates (at 50% drop of resistivity) was about 79K with a (10%–90%) transition width of less than 4K.

For superconducting thick film preparation, the present "spray-ICP" method provides higher deposition rates ($\geq 10$ μm/min) than most of the other known techniques. Compared with the deposition process using solid powder precursors, the use of liquid precursors is particularly suitable for depositing films of solid solutions of metal oxides, because all the components can be readily mixed in a homogeneous starting solution and the reactant feed rate can be easily controlled.

With minor modifications, such as by using different metal salts in different metal mole ratios, the present method can be employed to prepare any of the known superconductive ceramic oxides. The structures of three of the most widely-investigated classes of these materials is summarized in Table I, below. Other superconductive ceramic oxides which can be prepared by the present method are described hereinbelow.

TABLE I

| Superconductive Ceramics | | | |
|---|---|---|---|
| Formula | X | Y | Abbreviation |
| $La_{2-x}A_xCuO_4$ | 0.07–0.2 | — | 2-1-1[1,4] |
| $RZ_2Cu_3O_{7-x}$ | $0 < x < 1$ | — | 1-2-3[2,5] |
| $Bi_2Ca_{1+x}Sr_{2-x}Cu_2O_{8+y}$ | $0 < x < 1$ | $0 < y < 2$ | 2-1-2[3] |
| $TlCa_{x-1}Ba_2Cu_xO_{2x+3}$ | X = 1,2 or 3 | — | 1-(x − 1)-(2)-(x) |

[1] J. G. Bednorz et al., Z. Phys. B., 64, 189 (1986), (A = Sr).
[2] C. W. Chu et al., Phys. Rev. Lett., 58, 405 (1987), (R = Y).
[3] H. Maeda et al., Jpn. J. Appl. Phys., 27, L209 (1988); Z. Z. Sheng et al., Nature, 332, 55 (1988).
[4] A = Ba, Sr, Ca.
[5] R = lanthanide element, i.e., Y, Sm, Eu, Gd, Dy, Ho, Yb when Z = Ba; also $YSr_2Cu_3O_{7-x}$.

DETAILED DESCRIPTION OF THE INVENTION

Ceramic Superconductors

Figure 1:
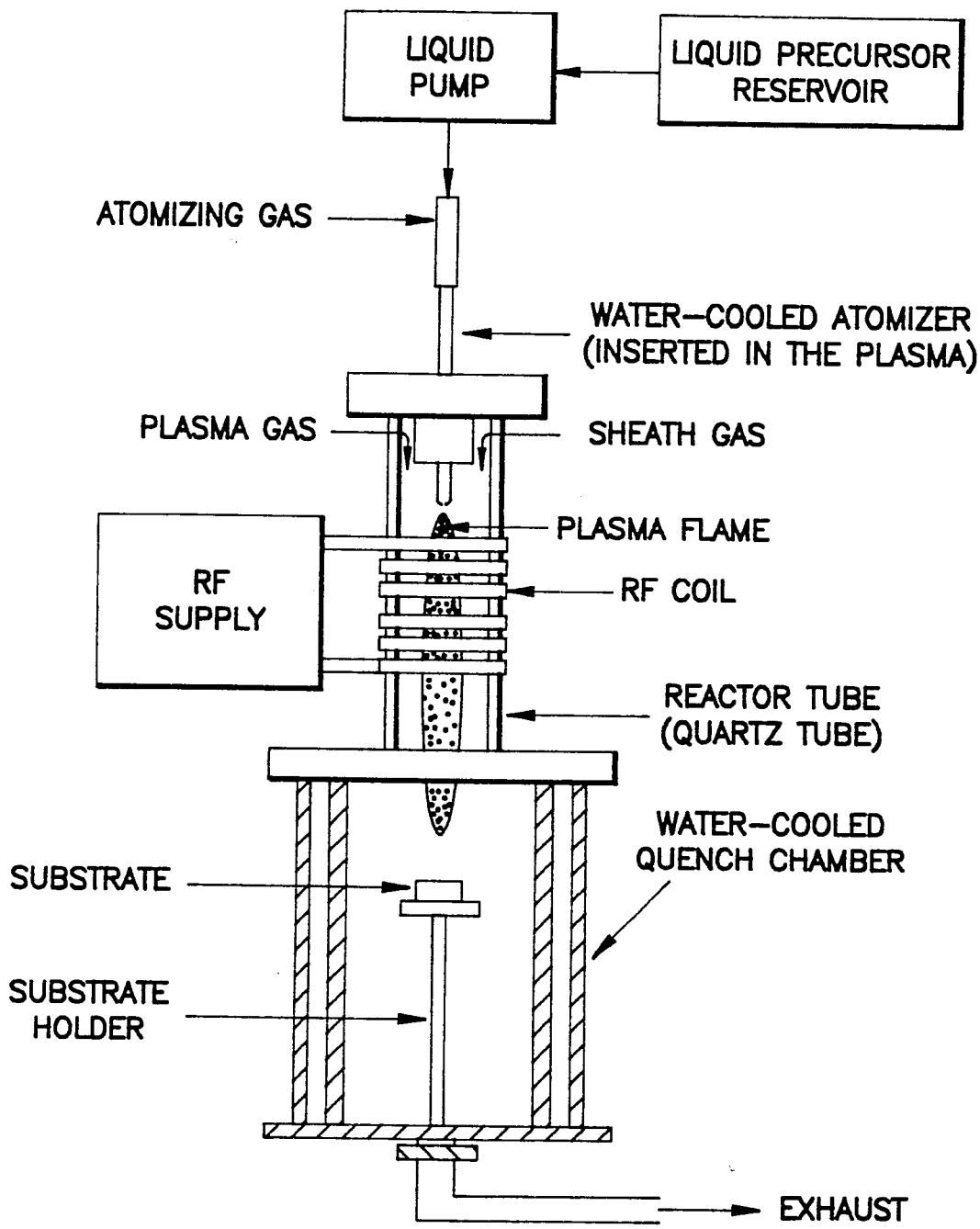

Superconducting oxides have been known since 1964, but until recently, the intermetallic compounds showed higher superconducting temperatures. In 1975, research scientists at E. I. DuPont de nemours discovered superconductivity in the system $BaPb_{1-x}Bi_xO_3$ with a $T_c$ of 13K. The structure for the superconducting composition in this system is only slightly distorted from the ideal cubic perovskite structure. It is generally accepted that a disporportionation of the Bi(IV) occurs, namely, 2Bi(IV) (6s$^1$)→Bi(III)(6s$^2$)+Bi(V)(6s$^0$) at approximately 30 precent Bi. The best superconductors were single phase, prepared by quenching from a rather restricted single-phase region, and hence, these phases are actually metastable materials. At equilibrium conditions, two phases with different values of x would exist; the phase with a lower value of x would be metallic and with a higher value of x would be a semiconductor. It is important to keep in mind that the actual assignment of formal valence states is a convenient way of electron accounting; the actual states include appreciable admixing of anion functions. Recently, for example, Cava and Batloff, Nature, 332, 814 (1988), have shown that $Ba_{0.6}K_{0.4}BiO_3$ gave a $T_c$ of almost 30K, which is considerably higher than the 13K reported for $BaPb_{0.75}Bi_{0.25}O_3$.

$La_2CuO_4$ was reported by Longo and Raccah, J. Solid State Chem., 6, 526 (1973), to show an orthorhombic distortion of the $K_2NiF_4$ structure with a=5.363Å, b=5.409Å and c=13.17Å. It was also reported that $La_2CuO_4$ has a variable concentration of anion vacancies and may be represented as $La_2CuO_{4-x}$. Superconductivity has been reported for some preparations of $La_2CuO_4$. See D. C. Johnston et al., Phys. Rev. B, 36, 4007 (1987). However, there appears to be some question as to the stoichiometry of these products since only a small portion of the material seems to exhibit superconductivity (P. M. Grant et al., Phys. Rev. Letters. 58, 2482 (1987)).

In the $La_{2-x}A_xCuO_4$ ceramics (A=Ca, Sr, Ba), the substitution of the alkaline earth cation for the rare earth depresses the tetragonal-to-orthorhombic transition temperature. The transition disappears completely at x>0.2, which is about the composition for which superconductivity is no longer observed.

The compound $YBa_2Cu_3O_7$ shows a superconducting transition of about 93K and crystallizes as a defect perovskite. The unit cell of $YBa_2Cu_3O_7$ is orthorhombic (Pmmm) with a=3.8198(1)Å, b=3.8849(1)Å, and c=11.6762(3)Å. The structure may be considered as an oxygen-deficient perovskite with tripled unit cells due to Ba-Y ordering along the c-axis. For the $YBa_2Cu_3O_7$, the oxygens occupy 7/9 of the anion sites. One-third of the copper is in four-fold coordination and two-thirds are five-fold coordinated. A reversible structural transformation occurs with changing oxygen stoichiometry going from orthorhombic at x=7.0 to tetragonal at x=6.0 (see P. K. Gallagher et al., Mat. Res. Bull., 22, 995 (1987)). The value x=7.0 is achieved by annealing in oxygen at 400°–500° C, and this composition shows the sharpest superconducting transition.

Recently, Maeda et al., cited above, reported that a superconducting transition of 110K was obtained for $Bi_2Sr_2CaCu_2O_8$. In most of the studies reported to date on the Bi/Sr/Ca/Cu/O system, measurements were made on single crystals selected from multiphase products. The group at DuPont selected platy crystals having a composition $Bi_2Sr_{3-x}Ca_xCu_2O_{8+y}(0.9>x>0.4)$ which showed a $T_c$ of about 95K. Crystals of $Bi_2Sr_{3-x}Ca_xCu_2O_{8+6}$ for x=0.5 gave orthorhombic cell constants a=5.399Å, b=5.414Å, c=30.904Å (M. A. Subramanian et al., Science, 239, 1015 (1988)). The structure consists of pairs of $CuO_2$ sheets interleaved by Ca(Sr), alternating with double bismuth-oxide layers.

There are now three groups of superconducting oxides which contain the mixed Cu(II)-Cu(III) oxidation states, namely, $La_{2-x}A_xCuO_4$ where $A^{II}=Ba^{+2}$, $Sr^{+2}$, or $Ca^{+2}RBa_2Cu_3O_7$ where R is almost any lanthanide; and $Bi_2Sr_{3-x}Ca_xCu_2O_{8+y}$. Z. Z. Sheng and Å. M. Herman, Nature, 332, 55 (1988) have recently reported a high-temperature superconducting phase in the system Tl/Ba/Ca/Cu/O. Two phases were identified by R. M. Hazen et al., *Phys. Rev. Lett.*, 60, 1657 (1988) namely $Tl_2Ba_2CaCu_2O_8$ and $Tl_2Ba_2Ca_2Cu_3O_{10}$. A. W. Sleight et al. [J. B. Parise and A. W. Sleight et al., *J. Solid State Chem.*, 76, 432 (1988); and M. A. Subramanian and A. W. Sleight et al., *Nature*, 332, 420 (1988)] have also reported the structure $Tl_2Ba_2CaCu_2O_8$ as well as $Tl_2Ba_2CuO_6$. In addition, superconductor $Tl_2Ba_2Ca_2Cu_3O_{10}$ has been prepared by the IBM group and shows a T of 125K. $TaBa_2Ca_3Ca_4O_x$ may exhibit a T as high as 160K.

A series of oxides with high T values has now been studied for the type $(A^{III}O)_2A_2^{II}Ca_{n-1}Cu_nO_{2+2n}$, where $A^{(III)}$ is Bi or Tl, $A^{(II)}$ is Ba or Sr, and n is the number of Cu-O sheets stacked. To date, n=3 is the maximum number of stacked Cu-O sheets examined consecutively. There appears to be a general trend whereby T increases as n increases.

There are compounds of Y, Ba, Cu and O in the 2-4-4 structure ($Y_2Ba_4Cu_4O_{20-x}$). Presumably, these can also form with rare earths substituted for Y. In the case of all of these compounds, they can be formed with different amounts of oxygen. Some of these materials have reduced transition temperatures or are insulators with very high dielectric constants.

There are various Bi-Ba-Sr-Cu-O compounds with various transition temperatures starting at about 50K and going up to 110K, depending on the details of the particular crystal structure and chemical composition ($Bi_2Sr_2CuO_{6\pm y}$, $Bi_2CaSr_2Cu_2O_{8+y}$).

The Pb-Bi-Ba-O compounds which are cubic perovskites, and all of their variants and substitutions are also possible products of the present method. These materials have reduced transition temperatures relative to the 1-2-3 compounds, the Bi and Tl compounds described above.

In principle, the present method could be used to produce other oxides in film form. This would include insulating and piezoelectric ceramics of various types. There are many examples where a common element is substituted onto one of the sites in the lattice of a high temperature superconductor, usually resulting in the depression or even complete suppression of the superconducting transition temperature. All of these materials can be prepared using the present method. An example is the replacement of Cu by Ag or Al.

Substrates

Although the present method is exemplified using polycrystalline $Al_2O_3$ and $ZrO_2$ as substrates, a wide variety of substrates can be employed including, but not limited to polycrystalline ceramic substrates, metallic substrates, and materials useful in semiconductor technology, such as GaAs<100>, GaAs<111>, GaAs<110>, Si<111>, Si<311>, Si<100>, and the like. Other oxides such as amorphous $Al_2O_3$, MgO, and $SrTiO_3$ can also be used, as can nitrides, such as silicon nitride. Stainless steel substrates can also be employed.

Metal Salts

Any metal salts which are water-soluble to the extent that the metal mole ratio can be maintained at a sufficiently high level with respect to the other metal ions present can be used in the present invention. Preferred metal salts include the water-soluble nitrate, halide, acetate and citrate salts of metals present in superconducting mixed metal oxides, such as Bi, Sr, Cu, Ca, Tl, La, Ba, Pb, K and the lanthanide elements (Y, Sm, Eu, Gd, Dy, Ho, and Yb). In some cases, it may be necessary to adjust the pH of the aqueous solution to achieve the necessary metal mole ratios. From about three to about five metal salts are commonly co-dissolved in water to form the present starting solutions.

Spray ICP Paramete

The rf plasma reactor system used to prepare representative superconducting films in accord with the present method is schematically depicted in FIG. 1. For other descriptions of the construction and operation of inductively coupled plasma reactors of ultrahigh temperature, see H. Zhu, Rf Plasma Syntheses of $YBa_2Cu_3O_{7-x}$ Powders Using a Liquid Solution Injection Technique, M. S. Thesis, Dept. of Chem. Eng., University of Minnesota (Sept. 1989).

For the deposition of thick films, the parameters to be considered will include the plasma composition, the concentration and composition of the liquid reactants, the mass injection rates of the liquid reactants, the substrate materials, the substrate stand-off distance, the temperature and traversing speed of the substrate, and the postannealing of the deposited films. Presently, pure argon plasmas (5,000–10,000K) are used in the deposition process, and argon-oxygen plasmas can also be used. The substrate stand-off distance will determine whether it is a chemical vapor deposition process or a particle nucleation process which will affect the qualities of the deposited films. Since the substrate will be heated by the plasma tail flame, cooling of the substrate via the water-cooled substrate holder may be necessary to control the substrate temperature. Whether the deposited films will be epitaxial is related to the concentration of the liquid reactants and the temperature of the substrate. The substrate traversing speed will affect the smoothness and uniformity of the film.

The invention will be further described by reference to the following detailed example.

Example I.

Preparation of $YBa_2Cu_3O_{7-x}$ Superconducting Films

The radiofrequency (rf) plasma reactor is depicted schematically in FIG. 1. The rf plasma reactor uses an rf power supply to generate the plasma flame, which is operated at a maximum plate power of 15 kW at 4 Mhz. In the present experiment, a plate power of about 10 kW was used. The plasma torch consists of a quartz reactor tube surrounded by an rf coil, which produces a relatively long plasma flame.

The argon sheath gas is injected at about 40 l/min. in the direction indicated (→), and serves to center and stabilize the plasma. The liquid precursors were prepared by dissolving yttrium nitrate, barium nitrate and copper nitrate in slightly acidified distilled water with a respective metal molar ratio of 1:2:3. The liquid precursors were atomized and injected into the rf plasma through a pneumatic atomizer located on the tip of a water-cooled probe which was lowered into the plasma core. The liquid reactant feeding rate, controlled by a liquid pump, was about 5 ml/min. Oxygen was used as an atomizing gas at a feed rate of 2.4 l/min. Polycrystalline $Al_2O_3$ and $ZrO_2$ discs (ca. 2 mm thick × 1 cm diameter) were used as substrates.

The crystal structure of the as-deposited and post-annealed films were analyzed by using x-ray diffraction (XRD) and the film morphologies were examined by scanning electron microscopy (SEM). For resistance measurements, a standard DC four-point technique was used to measure the resistance versus temperature, and hence, the transition temperature $T_c$.

The as-deposited ceramic films (ca. 10–20μ thick) were black, dense, semiconducting, but not superconducting. Therefore, post-annealing is necessary to introduce sufficient oxygen to obtain the superconducting phase. An important factor in film heat treatment is the film-substrate interaction which will significantly influence the $T_c$. Because the substrate temperature was between about 500° C. to 700° C. during deposition, it is usually during the post-deposition heat treatment (at higher temperatures) that most of the film-substrate interaction takes place.

The as-deposited films were removed from the reactor and annealed in a flowing oxygen tube furnace at 950° C. for 10 minutes and then slowly cooled down (3° C./min.) to room temperature in flowing oxygen to prevent them from losing their superconducting properties.

Figure 2:
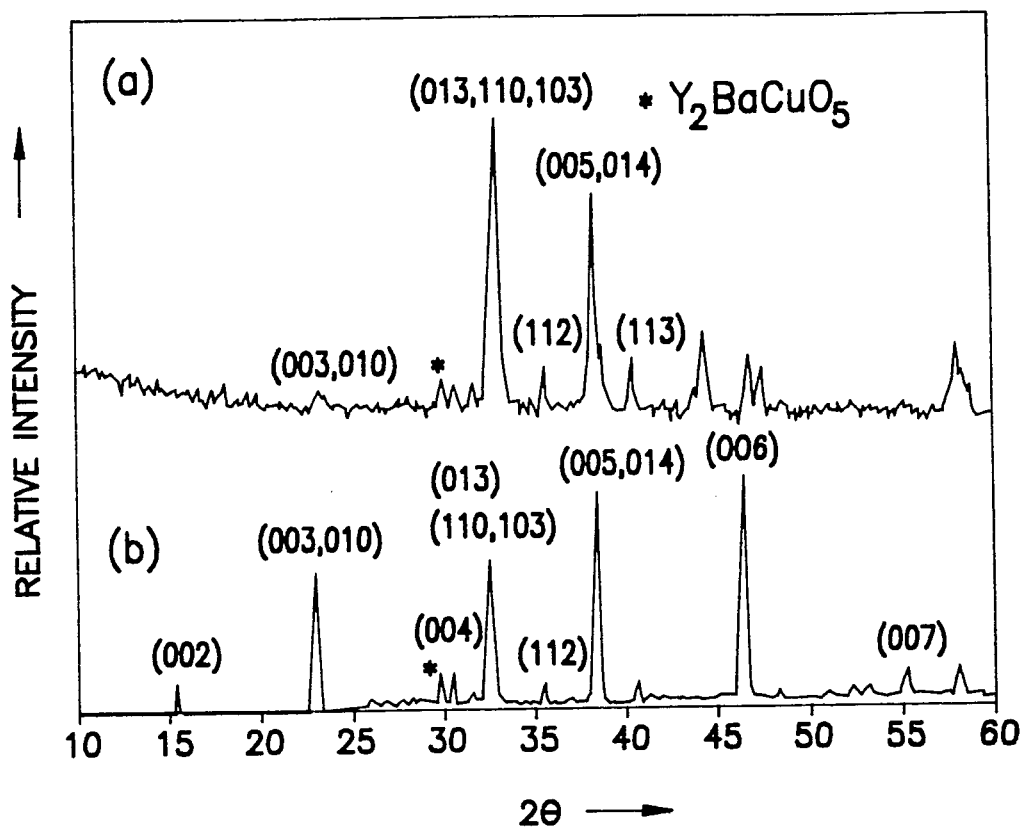

The XRD patterns of the annealed films, as shown in FIG. 2, indicate that the films are nearly single phase orthorhombic $YBa_2Cu_3O_{7-x}$ with small amounts of a second phase (mainly $Y_2BaCuO_5$). These films have strong (100) reflection peaks which are indicative of the existence of domains on the films having a preferential orientation of the crystalline c-axes perpendicular to the substrate surface.

A SEM photograph of the cross-section of an as-deposited film on an $Al_2O_3$ substrate indicated that the film surface is rough. The films are fairly dense and the growth rate is about 10 μm/min. Similar results were obtained for the films deposited on $ZrO_2$ substrates. Post-obtained annealing processes changed the surface morphology and reduced the porosity, producing denser films.

Figure 3:
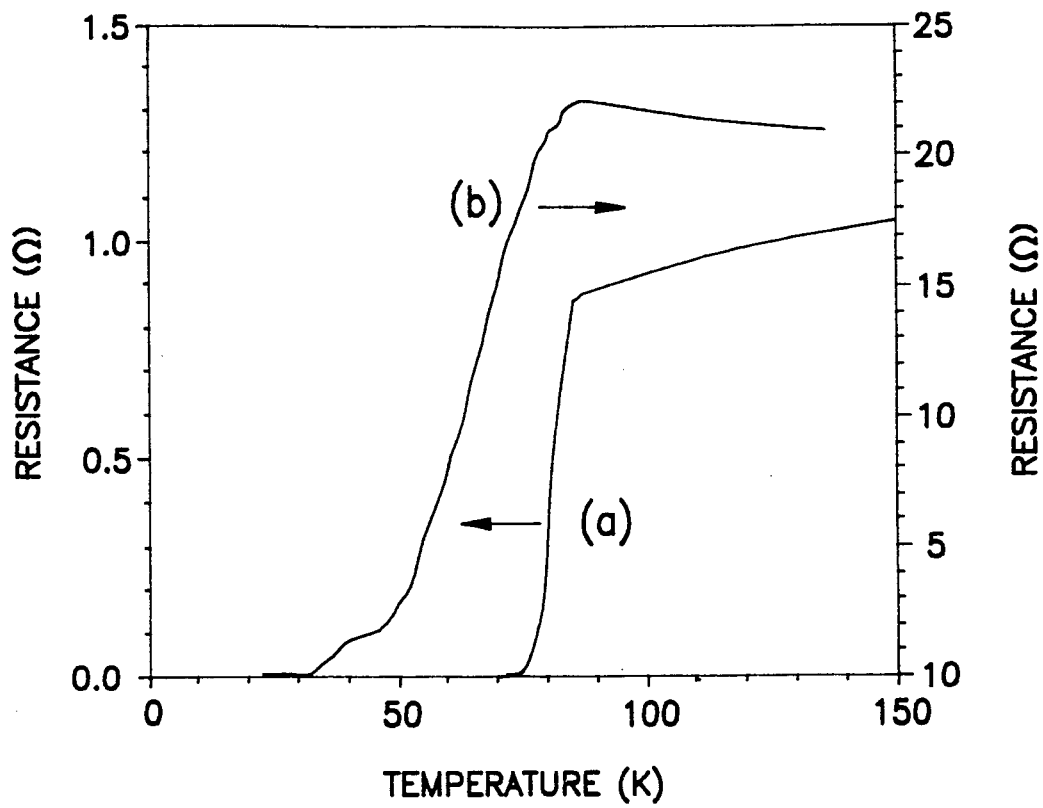
Figure 4:
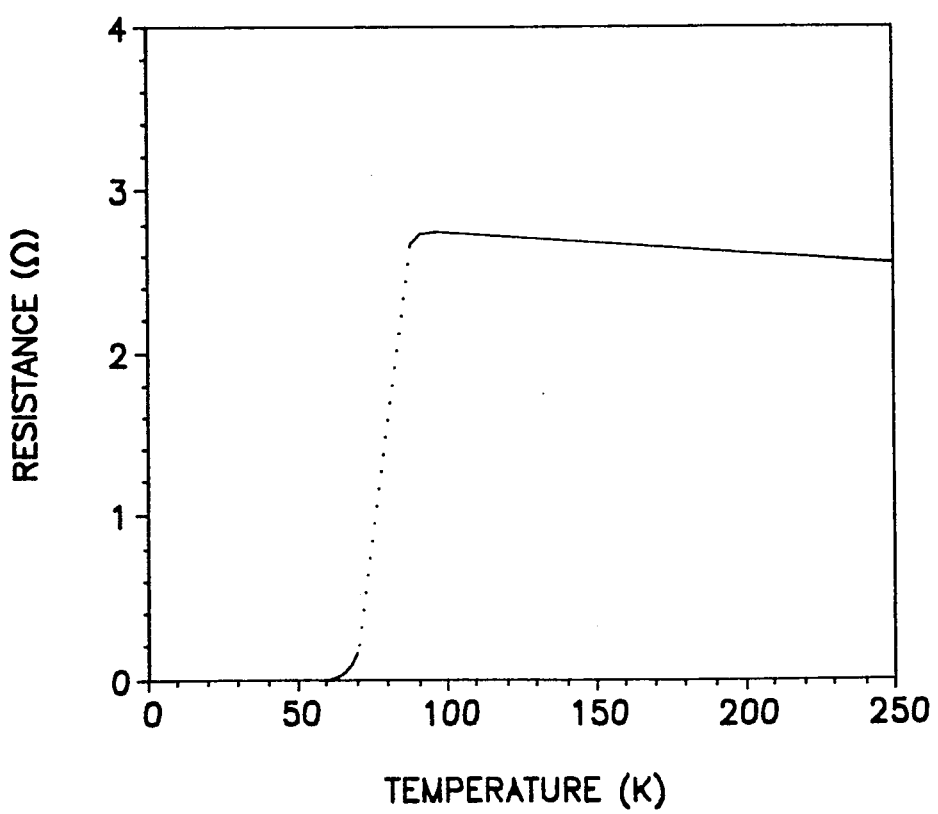

For films on $ZrO_2$ substratees, the superconducting transition temperature (at 50% drop of resistivity) was about 79K with a (10%–90%) transition width of less than 4K (FIG. 3, plot a). These films show metallic behavior above the transition temperature. For films on the $Al_2O_3$ substrates, the film-substrate interaction significantly influenced the superconducting transition temperature. These films show semiconducting properties above the transition temperature (FIG. 3, plot b). Semiconducting characteristics were also observed for films on $ZrO_2$ substrates after prolonged annealing (at 900° C. for 10 mins., then at 500° C. for 4 hrs., followed by slow cooling at about 3° C./min. to room temperature), indicating that film-substrate interaction has taken place (FIG. 4).

The disclosures of the papers cited herein are incorporated by reference herein. The invention has been described with reference to various specific and preferred embodiments and techniques. However, it should be understood that many variations and modifications may be made while remaining within the spirit and scope of the invention.

What is claimed is:

1. A method to apply a superconducting ceramic oxide by employing the techniques of inductively coupled ultrahigh temperature plasma deposition comprising:
   (a) introducing an atomized aqueous solution containing at least three metal salt precursors into an inductively coupled ultrahigh temperature plasma in relative amounts effective to deposit a coating of a mixed metal oxide on the surface of a heated substrate; and
   (b) annealing the mixed metal oxide coating in an oxygen atmosphere to yield a superconducting ceramic oxide coating.

2. The method of claim 1 wherein the plasma is an argon thermal plasma.

3. The method of claim 1 wherein the aqueous solution comprises about 3–5 metal salts.

4. The method of claim 3 wherein the aqueous solution contains salts of yttrium, barium and copper.

5. The method of claim 4 wherein the metal molar ratio in the aqueous solution is about 1:2:3.

6. The method of claim 5 wherein the superconducting mixed metal oxide film comprises $YBa_2Cu_3O_{7-x}$.

7. The method of claim 1 wherein the aqueous solution is atomized with oxygen.

8. The method of claim 1 wherein the substrate is polycrystalline $Al_2O_3$ or polycrystalline $ZrO_2$.

9. The method of claim 1 wherein the deposition rate is at least about 10 μm/min.

10. A method to apply a superconducting ceramic oxide by employing the techniques of inductively couple ultrahigh temperature plasma deposition comprising introducing an atomized aqueous solution containing at least three metal salt precursors into an inductively coupled ultrahigh temperature plasma, wherein said salt precursors are present in the necessary relative amounts, and wherein said plasma contains at amount of oxygen, effective to deposit a superconducting ceramic oxide coating on the surface of a heated substrate.

11. The method of claim 10 wherein the plasma is an argon/oxygen thermal plasma.

12. The method of claim 10 wherein the aqueous solution comprises about 3–5 metal salts.

13. The method of claim 12 wherein the aqueous solution contains salts of yttrium, barium and copper.

14. The method of claim 13 wherein the metal molar ratio in the aqueous solution is about 1:2:3.

15. The method of claim 14 wherein the superconductive ceramic oxide film comprises $YBa_2Cu_3O_{7-x}$.

16. The method of claim 10 wherein the aqueous solution is atomized with oxygen.

17. The method of claim 10 wherein the substrate is polycrystalline $Al_2O_3$ or polycrystalline $ZrO_2$.

18. The method of claim 10 wherein the deposition rate is at least about 10 μm/min.

19. The method of claim 1 wherein the plasma is at a temperature range of 5,000–10,000K.

20. The method of claim 10 wherein the plasma is at a temperature range of 5,000–10,000K.

* * * * *

UNITED STATES PATENT AND TRADEMARK OFFICE
CERTIFICATE OF CORRECTION

PATENT NO. : 5,032,568
DATED : July 16, 1991
INVENTOR(S) : Lau et al.

It is certified that error appears in the above-identified patent and that said Letters Patent is hereby corrected as shown below:

Column 4, line 58, for "$O_{8+6}$" read --$O_{8+Y}$--.

Column 5, line 11 (twice), for "T" read --$T_c$--.

Column 5, line 13, for "T" read --$T_c$--.

Column 5, line 19, for "T" read --$T_c$--.

Column 5, line 31, for "$O_{8+Y)}$." read --$O_{8 \pm Y})$.--.

Column 6, line 7, for "Paramete" read --Parameters--.

Column 7, line 26, for "(100)" read --(001)--.

Column 7, line 35, delete "obtained" after the word "Post-".

Column 8, lines 31 and 32, for "couple" read --coupled--.

Column 8, line 37, for "at" read --an--.

Signed and Sealed this

Second Day of February, 1993

*Attest:*

STEPHEN G. KUNIN

*Attesting Officer*  *Acting Commissioner of Patents and Trademarks*